ION-FREE INSULATING LAYERS

Filed May 1, 1970 3 Sheets-Sheet 1

INVENTORS
JAGTAR S. SANDHU
JAMES L. REUTER
ATTORNEY
Joseph L. Spiegel

ION-FREE INSULATING LAYERS

Filed May 1, 1970 3 Sheets-Sheet 2

ION-FREE INSULATING LAYERS

Filed May 1, 1970 3 Sheets-Sheet 3

United States Patent Office 3,666,546
Patented May 30, 1972

3,666,546
ION-FREE INSULATING LAYERS

James L. Reuter, East Fishkill, and Jagtar S. Sandhu, Fishkill, N.Y., assignors to Cogar Corporation, Wappingers Falls, N.Y.

Filed May 1, 1970, Ser. No. 33,701
Int. Cl. C23c *11/06*
U.S. Cl. 117—201 10 Claims

ABSTRACT OF THE DISCLOSURE

Ion contamination of insulators, such as thermally grown silicon dioxide layers on silicon wafers is virtually eliminated, if, after oxide growth, the wafers are cooled in an ion-free zone. A cylindrical, inner, quartz sleeve, preferably baffled, is interposed between the reaction tube and a wafer containing boat while a purging gas such as argon, nitrogen, helium and other inert gases is directed into the sleeve over the oxidized wafers to prevent contamination of the wafer by ions out-gassing from the walls of the reaction tube during the cooling cycle. Alternatively, the portion of the tube designated for wafer cooling is continuously baked before and during the oxide growth process and cooled simultaneously with the wafers thereby preventing the buildup of ions on the walls in the wafer cooling portion of the tube. Alternatively, a quartz sleeve is interposed between the wafer boat and reaction tube and extends from the hot zone and through the portion of the tube designated for wafer cooling. The inner sleeve is removed for wafer cooling.

BACKGROUND OF THE INVENTION

Field of the invention

This invention relates to improved methods and apparatus for fabricating semiconductor devices. While not so limited, the invention finds immediate application in thermally growing sodium-free silicon dioxide layers in the fabrication of metal-oxide-semiconductor (MOS) structures.

DESCRIPTION OF THE PRIOR ART

The typical, basic MOS structure comprises a wafer of low resistivity P-type semiconductive material with two spaced N-type source and drain regions for injecting current into and drawing current from a semiconductive material. A thin $SiO_2$ insulating layer is grown on the wafer between source and drain regions. If a positive voltage bias is applied to an electrode, the gate, on the $SiO_2$ layer, an N-type inversion layer or channel is formed between the two diffused regions. The geometry of the channel can be used to control current flow.

As in the fabrication of other semiconductive devices, the $SiO_2$ layer is usually formed by oxidation. The wafer is placed in a boat, the boat is inserted in a reaction tube and placed in the hot zone of a furnace. Typical conditions to grow a gate oxide of 500 A. thickness would be to use a hot zone temperature at 1000° C., while dry oxygen is passed over the wafer at a rate of 2 liters/min. for a period of 48 minutes. The boat is rapidly pulled out of the hot zone to the end of the tube where the now oxidized wafer is allowed to cool.

It is known that sodium ions are introduced into the oxide during this process. Further, it has been determined that sodium ion migration in these thermally grown $SiO_2$ layers is responsible for instability under temperature-bias stress and for poor device performance. See, for example, "Polarization Effects in Insulating Films on Silicon—A Review," by E. H. Snow et al., 242 Transactions of the Metallurgical Society of AIME 512 (March 1968).

Device performance and stability can be improved by minimizing the sodium concentration in the processing ambients. See, for example, "A simple Method for Preparing 'Sodium-Free' Thermally Grown Silicon Dioxide on Silicon," by F. Cocca et al., Proceedings of the IEFE, pp. 2193–95 (December 1967).

However, to date, efforts to find successful processes and apparatus for preparing sodium-free oxides have met with limited success.

SUMMARY OF THE INVENTION

Accordingly, an object of this invention is the elimination of ion contamination in insulating layers such as thermally grown silicon dioxide layers.

Another object of this invention is MOS structures with improved device performance and stability.

Still another object of this invention is the growth of insulating layers of uniform thickness.

A further object of this invention is the elimination of wafer warpage during post oxidation cooling.

It has previously been observed that where the oxide is grown using prior art apparatus and in accordance with prior art techniques, ions are introduced in the oxide during the processing cycle. Where a device has been processed according to the prior art, initially the majority of the ionic species, i.e., $Na^+$, are present at the air/insulator interface. These ions then diffuse toward the insulator/semiconductor interface under a thermal or voltage bias.

Accordingly, we have determined that the initial ionic contamination at the insulator/air interface is the result of contamination, not during the high temperature growth cycle, but during post-oxidation cooling. In accordance with the present invention, we have further found that post growth contamination is eliminated by precise control of cool-down conditions. Specifically, we have found that ion contamination of the thermally grown silicon dioxide layer is virtually eliminated if, after oxide growth, the wafers are cooled in an ion-free zone.

Thus, in accordance with one embodiment of the present invention, a cylindrical, inner sleeve, preferably baffled, is interposed between the reaction tube and the wafer containing boat. The inner sleeve and boat are then moved into the hot zone for oxide growth. Since the inner sleeve is baked during oxide growth, the contaminants do not condense on the sleeve. Once the wafers have been oxidized to a desired thickness, the inner sleeve and boat are pulled out of the hot zone to the end of the reaction tube for cooling. There, a purging gas is directed into the sleeve over the oxidized wafer. At the same time the sleeve prevents contamination of the wafers by ion out-gassing from the walls of the reaction tube. A further advantage of this embodiment is that the placement of a sleeve about the wafer boat within the hot zone creates an improved, isothermal region within the sleeve, thus resulting in more uniform oxide growth on the surface of a wafer. Otherwise any temperature gradient in the reaction tube within the hot zone would result in the growth of an oxide across the wafer of non-uniform thickness.

In accordance with another embodiment of the present invention, the portion of the tube designated for wafer cooling is continuously baked before and during the oxide growth process. This portion is then allowed to cool simultaneously with the wafers. Because of this baking, no contaminants condense in the wafer-cooling portion.

A further advantage of these two embodiments is the elimination of the possibility of wafer warpage during cooling.

In accordance with still another embodiment of the present invention an inner sleeve is placed in the reaction tube about the wafer boat. The sleeve extends from the hot zone and through the portion of the tube designated for wafer cooling. The inner sleeve is removed for wafer cool-down, thereby leaving the portion of the tube designated for wafer cooling contaminant-free.

BRIEF DESCRIPTION OF THE DRAWING

The foregoing and other objects, features and advantages of the invention will be apparent from the following more particular description of the preferred embodiments of the invention as illustrated in the accompanying drawings wherein.

DETAILED DESCRIPTION OF THE PREFERRED EMBODIMENTS

Figure 1:
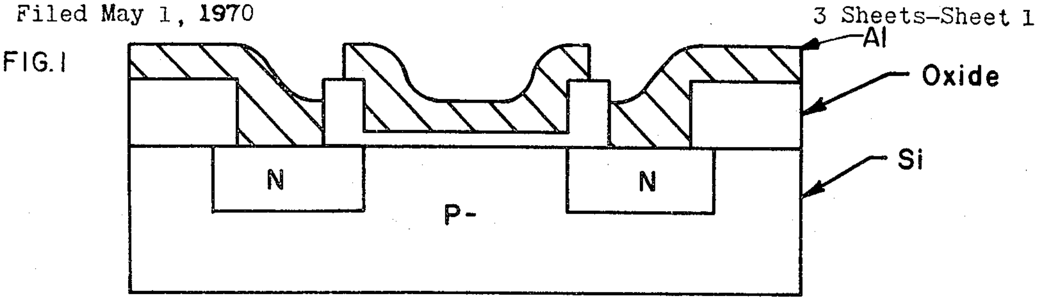
FIG. 1 is a typical MOS structure shown schematically in cross-section.

While not so limited, the invention finds immediate application in thermally growing sodium-free silicon dioxide layers ($SiO_2$) in the fabrication of metal-oxide-semiconductor (MOS) structures. Referring now to FIG. 1 a typical MOS structure is illustrated as including a wafer of low resistivity P-type semiconductive material having two spaced N-type regions known as the source and drain regions to which ohmic contacts have been applied. A thin $SiO_2$ insulating layer is grown from the P-region between the source and drain regions. If a positive voltage bias is applied to an electrode, the gate, on the $SiO_2$ layer, an N-type inversion layer or channel is formed between the two diffused regions. The geometry of the channel can be used to control current flow.

Figure 2A:
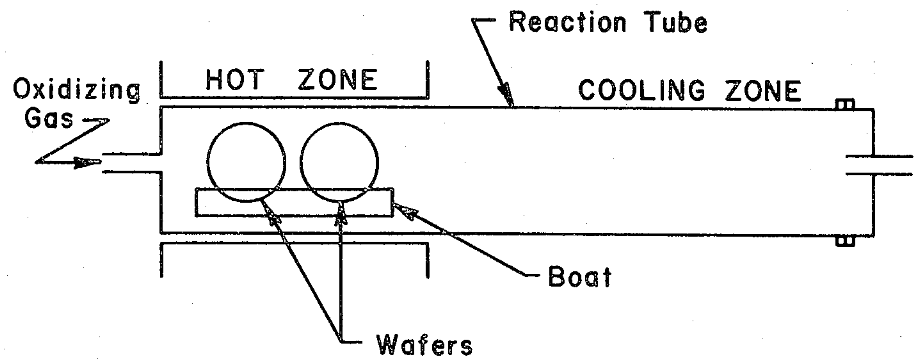
FIG. 2*a* illustrates schematically a typical prior art arrangement for growing $SiO_2$ layers on a semiconductive material with the wafer boat shown in the hot zone where the oxide is grown.
Figure 2B:
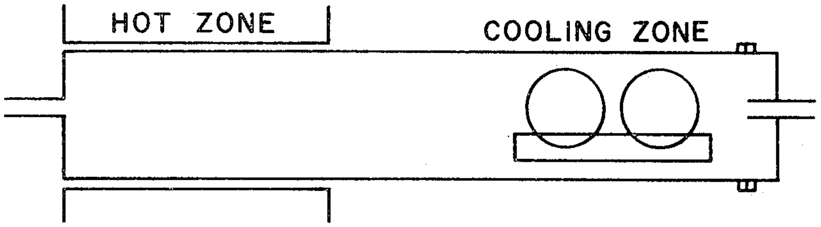
FIG. 2*b* is a view similar to that of FIG. 2*a* but now with the wafer boat moved to that portion of the reaction tube where cooling takes place.

This $SiO_2$ layer is formed by oxidation. In accordance with prior art techniques, the wafer typically 2¼" and larger in diameter which is to be oxidized is placed in a boat, the boat is inserted in a reaction tube and placed in the hot zone of a furnace at say 1000° C. (FIG. 2*a*). Oxygen is passed over the wafer at a rate of 2 liters/min. for a period of say 48 minutes until an oxide 500 A. thick is produced. The boat is rapidly pulled out of the hot zone to the end of the tube and the oxidized wafer is allowed to cool (FIG. 2*b*).

During oxidation ions are present in the oxidizing ambient. Since the reaction tube is being baked in the region of the hot zone the ions do not condense on the tube in this region. Instead, by means of the oxidizing medium and partial pressure differential, these ions migrate and are swept out of the hot zone to the end of the tube where they condense on the cooler walls of the reaction tube.

However, when the wafer containing boat is moved to the cooling zone, this causes the walls of the reaction tube in this cooler region to heat up. The previously condensed ions now out-gas from the walls of the tube and contaminate the cooling oxide layer. The purpose of our invention, therefore, is to eliminate contamination of the oxide layer during cooling.

Figures 3A, 3B:
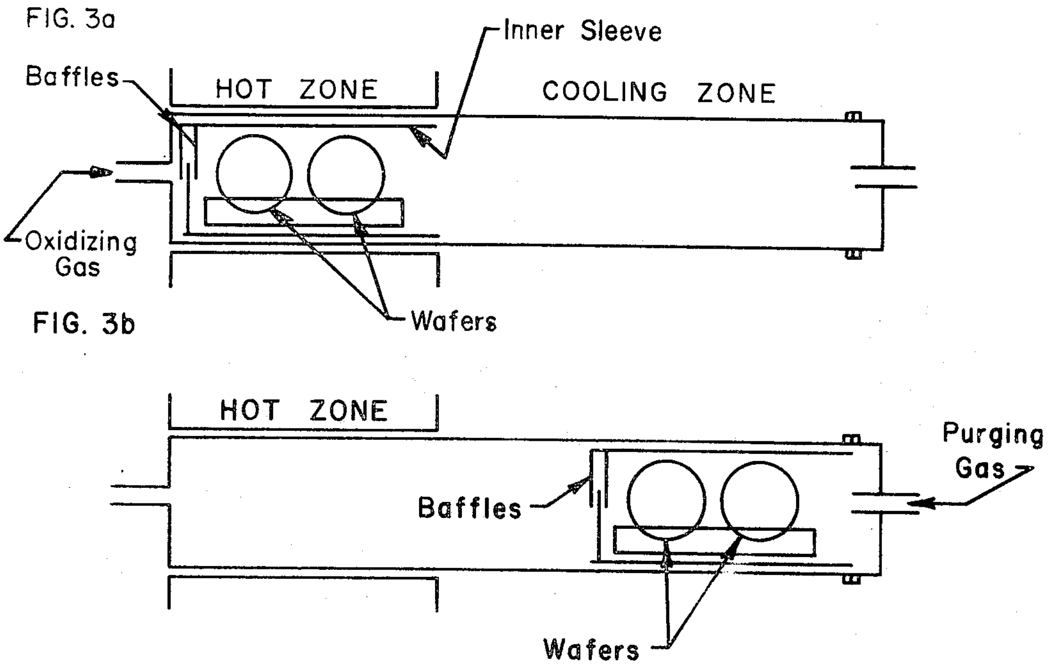
FIG. 3*a* illustrates a first embodiment of our invention in which the wafer boat, positioned within the hot zone where the oxide is grown, is enclosed within a baffled, cylindrical sleeve.
FIG. 3*b* is a view similar to that shown in FIG. 3*a* with the wafer boat and sleeve now moved to that portion of the reaction tube where cooling takes place and with a purging gas being directed into the sleeve over the oxidized wafer.

In accordance with one embodiment of our invention, as illustrated in FIG. 3*a*, a cylindrical, inner sleeve preferably quartz, is interposed between the reaction tube and the wafer-containing boat. This sleeve is removably mounted on the boat and is preferably baffled. The inner sleeve and boat are moved into the hot zone for oxide growth. Since the inner sleeve is baked during oxide growth, there is no contamination of the sleeve. Once the wafers have been oxidized to the desired thickness, the inner sleeve and boat are pulled out of the hot zone to the cooling zone. There a purging gas is directed into the sleeve. The baffle acts to eliminate back diffusion of ions into the cooling zone. Typical purging gases are argon preferably, nitrogen, helium, and other inert gases. A purging flow rate of 2 liters/min. is quite satisfactory. The purging gas lowers the likelihood of contamination by dilution. At the same time the sleeve prevents contamination of the wafer by ions out-gassing from the walls of the reaction tube. Either mechanism alone, i.e., dilution by a purging gas or isolation by a sleeve, reduces contamination. Best results are achieved when both mechanisms are employed to obtain an ion-free region. Following these teachings has resulted in contamination levels in the oxide of less than $5 \times 10^{10}$ ions/cm.$^2$.

A further advantage of this embodiment is that the placement of a sleeve about the wafer within the hot zone creates an improved isothermal region within the sleeve thus resulting in more uniform oxide growth over the entire surface of the wafer. The sleeve introduces a thermal mass surrounding the wafer which leads to more uniform temperature recovery. Any temperature gradient which would otherwise exist in the hot zone results in the growth of an oxide across the wafer of relatively non-uniform thickness.

Figure 4A:
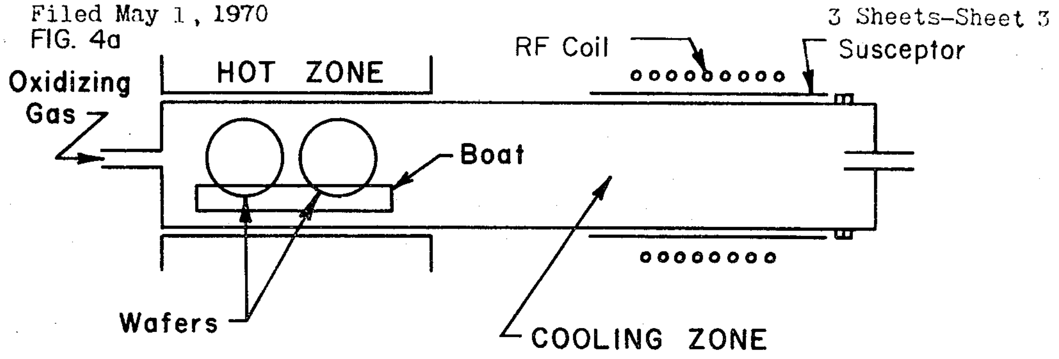
FIG. 4*a* is a second embodiment of our invention with wafer boat in the hot zone for oxide growth and with that portion of the reaction tube set aside for cooling being baked simultaneously.

FIG. 4*a* illustrates another embodiment of our invention. In this embodiment, at the same time that the oxide is being formed on the wafers within the hot zone, the portion of the reaction tube where cooling takes place is being continuously baked, as, for example, by means of an RF coil and susceptor arrangement (FIG. 4*a*). After the oxide has been formed the boat is moved to the cooling zone and the heating means there is shut off. Because of the baking of the cooling zone, no contaminants condense on the walls of the tube during oxide growth; hence there is no out-gassing during cooling of ion contaminants. A further advantage of this embodiment as well as the previous embodiment is elimination of the possibility of wafer warpage since the reaction tube in the case of FIG. 4, and the sleeve in the case of FIG. 3, cools along with the wafer and boat.

Figure 4B:
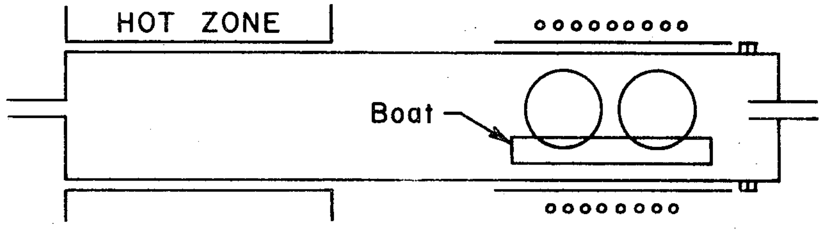
FIG. 4*b* is a view similar to that illustrated in FIG. 4*a* with the wafer boat now moved to the cooling zone.
Figure 4C:
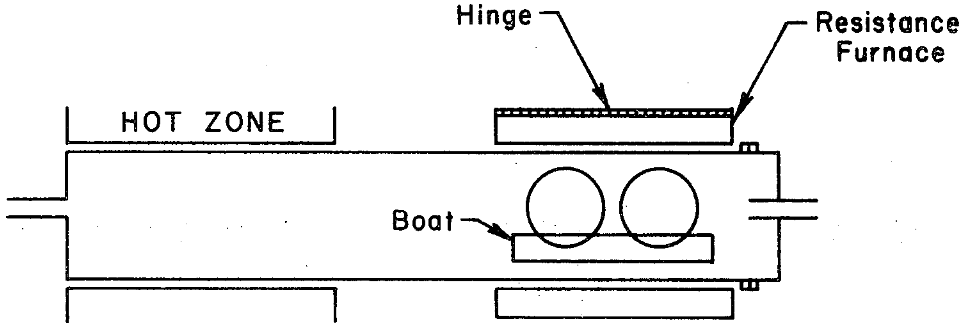
FIG. 4*c* is a view similar to that illustrated in FIG. 4*b* but with a different type cooling zone heating means.

FIG. 4*c* is similar to FIG. 4*b* except that a resistance furnace has been used for the means to heat the cooling zone rather than the RF coil and susceptor arrangement shown in FIG. 4*b*.

Figure 5A:
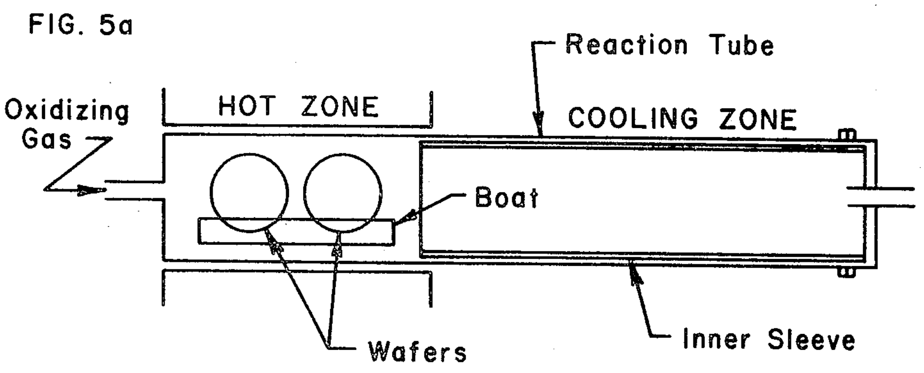
FIG. 5*a* illustrates another embodiment of the present invention with the wafer boat positioned within the hot zone enclosed within an inner sleeve which extends from the hot zone and through the cooling zone.
Figure 5B:
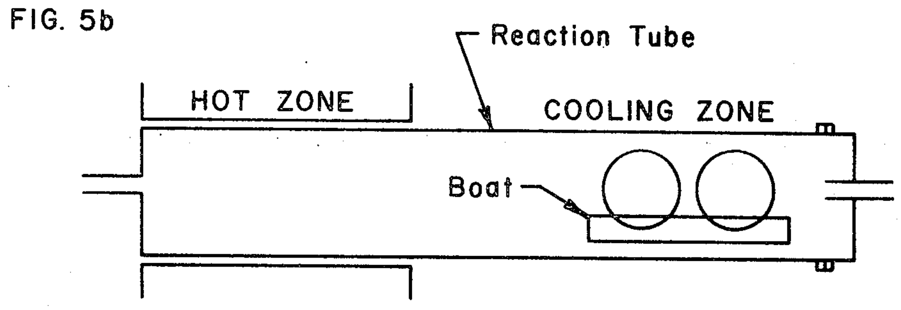
FIG. 5*b* is similar to that shown in FIG. 5*a* but with the inner sleeve now removed and the wafer boat moved to the cooling zone.

FIG. 5 illustrates still another embodiment of the present invention. In this embodiment, an inner sleeve extends from the hot zone and through the portion of the reaction tube designated for wafer cooling. The wafer boat is placed within the inner sleeve for oxide growth (FIG. 5*a*). After the oxide has been formed the inner sleeve is removed for wafer cool-down, thereby leaving the portion of the reaction tube designated for wafer cooling contaminant-free.

The previous discussion has centered about silicon semiconductor material and an insulating layer $SiO_2$ formed by oxidation. It should be apparent that the invention is applicable to other semiconductive materials such as Ge, GaAs and GaP. Furthermore, the invention is applicable where other insulators are formed such as $Si_3N_4$ and $Al_2O_3$ and where other methods are used for forming the insulator such as pyrolitic deposition. In all of these situations it would be advantageous, after insulator formation, to cool in an ion-free region.

While the invention has been particularly described and shown with reference to the preferred embodiments thereof, it will be understood by those skilled in the art that various changes in form and detail and omissions may be made therein without departing from the spirit and scope of the invention.

What is claimed is:

1. In the method of forming an insulating layer on a semiconductor substrate during a heat cycle, and subsequently cooling said substrate within a chamber, the improvement which comprises isolating said substrate from contaminating ions during cooling by providing a sleeve within the chamber which prevents contaminating ions within the chamber from reaching said substrate.

2. The invention according to claim 1 which includes enclosing said substrate within said sleeve during cooling.

3. The invention according to claim 1 which includes directing a purging gas over said substrate during cooling.

4. In the method of thermally growing a silicon dioxide layer on a silicon wafer, which includes placing the wafer in a boat, inserting said boat in a reaction tube, moving said wafer-containing boat to a first portion of said reaction tube where said wafer is exposed to an elevated temperature and an oxidizing medium is passed over said wafer until a silicon dioxide layer of desired thickness is grown on said wafer, and subsequently moving said wafer containing boat to a second portion of said tube for cooling said wafer, the improvement which comprises isolating said wafer from contaminating ions in said second portion of said tube during cooling by providing a sleeve within the tube which prevents contaminating ions within the tube from reaching said wafer.

5. The invention according to claim 4 which includes enclosing said wafer containing boat within said sleeve in said first portion of said reaction tube during oxidation and subsequently moving said wafer containing boat and sleeve to said second portion of said tube for cooling.

6. The invention defined by claim 5 including directing a purging gas over said wafer during cooling.

7. The invention defined by claim 4 including baking said second portion of said reaction tube while said wafer is exposed to an elevated temperature in said first portion of said tube.

8. In the method of thermally growing a silicon dioxide layer on a silicon wafer which includes placing said wafer in a boat, inserting said boat in a reaction tube, moving said wafer containing boat to a first portion of said reaction tube where said wafer is exposed to an elevated temperature while an oxidizing medium is passed over said wafer until a silicon dioxide layer of desired thickness is grown on said wafer, the improvement which comprises enclosing said wafer containing boat within a sleeve within said tube to prevent contaminating ions from reaching said wafer during oxide growth and during cooling.

9. In the method of thermally growing a siilcon dioxide layer on a silicon wafer, which includes placing said wafer in a boat, inserting said boat in a reaction tube, moving said wafer containing boat to a first portion of said reaction tube where said wafer is exposed to an elevated temperature while oxidizing medium is passed over said wafer until a silicon dioxide layer of desired thickness is grown on said wafer and subsequently moving said wafer containing boat to said second portion of said tube for cooling, the improvement which comprises isolating said wafer from contaminating ions during cooling by providing a sleeve within the tube and directing a purging gas over said oxidized wafer during cooling which prevents contaminating ions within the tube from reaching said wafer.

10. In the method of thermally growing a silicon dioxide layer on a silicon wafer, which includes placing the wafer in a boat, inserting said boat in a reaction tube, moving said wafer-containing boat to a first portion of said reaction tube where said wafer is exposed to an elevated temperature and an oxidizing medium is passed over said wafer until a silicon dioxide layer of desired thickness is grown on said wafer, subsequently moving said wafer-containing boat to a second portion of said tube for cooling said wafer, and inserting a sleeve within said tube which extends from said first portion through said second portion of said reaction tube during oxidation and removing said sleeve during cooling, which prevents contaminating ions from reaching said wafer.

References Cited

UNITED STATES PATENTS

| | | | |
|---|---|---|---|
| 3,322,577 | 5/1967 | Smith | 117—106 X |
| 3,446,659 | 5/1969 | Wisman et al. | 117—106 X |
| 3,554,162 | 1/1971 | Cota et al. | 118—48 |

RALPH S. KENDALL, Primary Examiner

C. WESTON, Assistant Examiner

U.S. Cl. X.R.

117—106 A, 229